United States Patent [19]
Dawkins

[11] 3,934,514
[45] Jan. 27, 1976

[54] FIRING DEVICES AND PROCESSES

[75] Inventor: Maxwell John Dawkins, Nunawading, Australia

[73] Assignee: ICI Australia Limited, Melbourne, Australia

[22] Filed: May 8, 1973

[21] Appl. No.: 358,348

[30] Foreign Application Priority Data
May 29, 1972  Australia.............................. 9137/72

[52] U.S. Cl............................... 102/70.2 R; 317/80
[51] Int. Cl.² ........................................ F42C 11/06
[58] Field of Search................... 102/70.2 R, 22, 23; 317/80

[56] References Cited
UNITED STATES PATENTS

| | | | |
|---|---|---|---|
| 2,546,686 | 3/1951 | Bickel et al............................ | 102/23 |
| 3,102,476 | 9/1963 | Naeseth................................. | 102/22 |
| 3,133,231 | 5/1964 | Fail et al.......................... | 102/70.2 R |
| 3,306,208 | 2/1967 | Bergey et al.................... | 102/70.2 R |
| 3,312,869 | 4/1967 | Werner................................. | 317/80 |
| 3,316,451 | 4/1967 | Silberman........................ | 102/70.2 R |
| 3,417,259 | 12/1968 | Nozawa et al. ................. | 102/70.2 R |
| 3,424,924 | 1/1969 | Leisinger et al. ............... | 102/70.2 R |
| 3,571,605 | 3/1971 | Dobson et al................... | 102/70.2 R |

Primary Examiner—Verlin R. Pendegrass
Assistant Examiner—C. T. Jordan
Attorney, Agent, or Firm—Cushman, Darby & Cushman

[57] ABSTRACT

Electrical timing and control apparatus for sequentially activating a plurality of electrical load circuits at predetermined and controllable successive timing intervals after the occurrence of a first starting signal wherein the activation sequence is automatically halted whenever any one of the electrical load circuit fails to be successfully activated.

16 Claims, 5 Drawing Figures

FIG_2.

FIRING DEVICES AND PROCESSES

This invention relates to a signalling device and in particular it relates in one embodiment to an electrical signalling device whereby two or more electrical circuits may be activated in a preselected sequence at preselected time intervals.

Our device in a general form is one capable of transmitting signals from an original point in a system to a multiplicity of locations in a manner such that said signals reach the said locations in a preselected sequence at preselected time intervals. The signals may be of differing types. Thus for example they may be pressure signals transmitted in a fluidic system for example a system operated by a liquid such as water, or a system operated by a gas such as air or nitrogen. Alternatively they may be signals created by a change of temperature in a system which for example causes variations in pressure within such a system or activates a mechanical or electrical signalling means within a system. Yet again the signals may be created by varying the conditions within an electrical circuit. Still further the signals may be created by variations made in a source of wave borne energy for example from a source of visible, ultraviolet or infra red light or X-rays, or from a source of sound or from a laser beam.

Accordingly we provide a device comprising in combination a first component actuated by a first transient signal and on actuation capable of transmitting a second transient signal capable of actuating a first apparatus external to the device said first component also being capable of transmitting for a selected period of time-commencing at the time whereat said second signal is transmitted-a third signal to a second component; a third component actuated by actuation of said first apparatus which third component on actuation is capable of transmitting a fourth signal for a selected period of time to said second component actuated by the change from a first condition imposed by the simultaneous receipt of said third and fourth signals to a second condition imposed by the cessation of either of said third or fourth signals and wherein on actuation of said second component said second component produces a transient fifth signal capable of actuating a second apparatus external to the device.

It is known that electricity can be supplied to two or more electrical circuits at varying time intervals, but hitherto difficulty has been experienced when the time interval required has been small for example a time interval of the order of 10 milliseconds. Furthermore with the circuitry of the prior art difficulties have been experienced in maintaining the accuracy of the required time interval within tolerable limits. Still further the solution to the problem of providing a "fail-safe" condition in a multiplicity of circuits or locations by which we mean the requirement that if a circuit or location within a system has not been activated, then subsequent circuits or locations in the system will remain unactivated, has not been achieved in a reliable manner, particularly in the instance where the system is part of a device of small dimensions, for example a portable electrical device.

We have now discovered that by a suitable choice and arrangement of components used to form an electrical circuit the difficulties encountered with prior art devices may be minimized or in some instances overcome completely.

Accordingly in one embodiment of our invention we provide an electrical device comprising a first time switch capable of changing the potential of a first conducting means from a positive potential to zero potential and simultaneously changing the potential of a second conducting means from zero potential to a positive potential for only a selected first period of time and wherein said first time switch is capable of being actuated by a change of potential from positive to zero in the output of an actuating device and wherein said first conducting means is connected to a component which is capable of switching on an output circuit when the potential of said first conducting means changes from positive to zero; a second time switch actuated by potential change in said output circuit which seecond time switch when actuated changes the potential of a third conducting means from zero to positive for only a second selected time period; a logic switch which maintains a positive potential in a fourth conducting means only if the potential of both the second and third conducting means is also positive and maintains the potential of said fourth conducting means at zero potential if the potential of either or both of second and third conducting means is zero.

In the foregoing description reference has been made for ease of description to changes in potential from positive to zero and vice versa. However it will be readily apparent to those skilled in the art that such changes in potential need not be restricted to such limits and that other changes in potential may be used if desired. Devices as hereinbefore described but using such differing changes in potential lie within the scope of our invention.

Our device may be constructed from components which are well known. Thus the time switch may be for example a mechanical device such as a shaft and cam operated switching devices: alternatively the time switch may be formed from mechanical and electrical components in combination. We prefer that the time switch be an electrical component for example a mono-stable multi-vibrator. Such electrical components are advantageous in that they are of small dimensions. An added advantage is that such time switches are adjustable to provide time intervals which may vary over a wide range and the accuracy of reproduction of a desired time range is comparatively independent of the length of the chosen time interval. For example certain of the commercially available mono-stable multi-vibrators are capable of maintaining time intervals over prolonged periods of usage within 1 millisecond and often within 0.1 millisecond of the desired time interval which may be varied from as long as several minutes to as short as a millisecond or even less. We have found that such mono-stable multi-vibrators are particularly useful in our device when the time range required is from 5 to 500 milliseconds say from 10 to 100 milliseconds.

The conducting means used in our device are those means normally used to conduct electricity within an electrical device. Thus such means may be for example metal conductors in the form of wire or alternatively they may be part of a so-called printed circuit.

Suitable actuating devices are devices which provide a means of changing a potential in a circuit. From amongst the many actuating devices known there may be mentioned for example the so-called "on-off" switches, rheostats and the like. Such actuating devices have been developed in many forms, sizes and shapes to suit the requirements of a particular purpose; for example for blasting purposes in the mining industry such devices are often in the form of the well known firing buttons or plungers.

The component used for switching on a circuit external to our device may be varied dependent of the characteristics of the external circuit. Thus for example in the instance where it is desired to apply a high voltage and a high current to switch on such a circuit it is convenient to use a capacitor in conjunction with suitable switching means for example a relay or a solid state device such as a silicon controlled rectifier.

The logic switch used in our device should be a device which does not allow electricity to proceed from its outlet to subsequent parts of a circuit until the switch has received a requisite number of signals from prior portions of the circuit to allow it to be activated. Typical of such devices are the well known and so-called "AND" gates.

Where desired our device may also contain within its circuitry other conventional devices found in electrical circuits, for example current flow or isolation of circuits may be controlled by inclusion of appropriate resistors.

Our device may be operated from either a direct or alternating current source of electrical power and the voltages of such a source may vary. Thus for example a source of electrical power may be a low voltage direct current source, for example a series of 1½ volt dry cells connected so as to provide a 12 volt source. Alternatively an alternating current power supply may be transformed and rectified to provide a low voltage, say 5 volts, direct current source of power.

Our device is particularly useful for transmitting signals to a multiplicity of locations in such a manner that said signals reach the said locations in a preselected sequence at preselected times. In the instances where signal transmission to two locations is desired only one logic switch is required. However a series in combinatin of devices according to our invention may be used if signal transmission to more than two locations is desired. Accordingly we provide a process of transmitting signals in a preselected sequence at preselected times to two or more locations wherein said process is characterized in that said process comprises transmitting said signals to said locations by means of our device as hereinbefore described. Our process may be characterized further in that the forward transmission of signals within our device is halted if compliance of said signals with preselected conditions within our device is not obtained. Thus a fail-safe condition within our process may be achieved.

Our device is particularly useful when used in mining operations, particularly in operations involving blasting of orebodies wherein a blasting operation comprises the detonation in sequence of a series of explosive charges located in an orebody. In modern mining practice it is desirable to locate and detonate a series of explosive charges in a pattern designed to produce a maximum of broken ore body of a desired size with the minimum usage of explosive material and a minimum of vibration in the area of the explosion. One typical method used is the so-called ring blasting technique wherein a multiplicity of explosive charges, say 4, 10, 40, 200 or even more charges, is located in an ore body; the charges are primed individually with delay detonating devices; the detonating devices are then all activated simultaneously by an electrical pulse; and the activated detonators then detonate the explosive charges. However for such a technique to be successful commercially it is desirable that the detonation of the explosive charges occur in a predetermined sequence at appropriate time intervals. Since all the detonators are activated at the same time, the required range of delay detonators is considerable for any one blasting operation if the appropriate sequence and time intervals are to be achieved. Thus for example if four rings each of five explosive charges are required to be detonated in sequence with a delay between each detonation then 20 detonators each having a different delay period will be required. This creates difficulties in the supply, storage and segregation of detonators and also adds to problems of safety in ensuring that the appropriate detonators are used in the desired sequence. A further disadvantage of the ring blasting technique as currently performed wherein all the detonators are activated simultaneously, is that even in the event of a non-detonation of one or more explosive charges the residual explosive charges will still be detonated. This results in undetonated explosive charges being buried within the broken ore body obtained as a result of the blasting operation and provides a safety hazard when the broken ore is to be recovered for further treatment. A still further disadvantage is that because of the inherent variation from the optimum in the delay characteristics of individual detonators, there is a cumulative variation in the overall delay with a number of detonators; this cumulative variation will increase with the number of detonators and where the number is large, say from 100 to 200, the variation may become commercially unacceptable. Yet again the minimum time delay between detonations is sometimes greater than would be desirable for certain purposes. The difficulties and disadvantages outlined above may be overcome or minimized if the detonators in a blasting system, particularly in a ring blasting system, are activated by apparatus comprising our device or a multiplicity of our devices in an electrical embodiment as hereinbefore described in combination. Thus for example if in a ring blasting system there are four rings each of five explosive charges requiring detonation then by activating each ring independently at appropriate time intervals by means of our device the number of different delay detonators is reduced to 5 instead of 20 as described hereinbefore. Furthermore because our device contains a logic switch the possibility of the occurrence of detonations of explosive charges subsequent to a non-detonation of a charge is eliminated. Since each ring is activated individually in sequence the cumulative variation in the overall delay over the entire system may be reduced substantially in comparison with that obtained by the use of prior art procedures.

Accordingly we provide in a process of blasting wherein the detonation of a series of explosive charges is initiated by activated detonating means in a preselected sequence at preselected time intervals the improvement comprising the step wherein said detonating means are activated consequent of transmission to said detonating means of a sequence of activating signals from an apparatus comprising one or more devices according to our invention.

Devices in an electrical embodiment of our invention are eminently suitable for use in processes of sequential blasting. Accordingly we provide a process of blasting which process comprises the steps of firstly, placing explosive charges in a series of locations; secondly, connecting suitable detonating means to each of said explosive charges in a manner such that said detonating means when activated by an electrical signal is capable of initiating detonation of said explosive charge; thirdly, connecting said detonating means to an apparatus comprising one or more electrical devices according to our invention; and fourthly actuating said device or devices so as to transmit a sequence of electrical signals to said detonating means whereby said detonating means are activated thereby initiating detonation of said explosive charges in a preselected sequence at pre-selected time intervals. Since our device is provided with a logic switch which is operative if there is a malfunction of a detonation means whereby a particular explosive charge is not detonated and thereby transmission of signals of detonating means subsequent to the non-detonated charge is halted our processes of blasting as hereinbefore described comprise the additional step of preventing the detonation of further explosive charges subsequent to the non-detonation of an explosive charge.

By means of our device the control of delay periods of time used in sequential blasting operations has been enhanced. Hitherto such operations were normally performed by means of delay detonators. Such detonators usually limited the delay periods to a minimum of about 20 milliseconds since they commonly contained both a chemical and an electric detonating means. By the use of our device we have now found that sequential blasting processes may be performed satisfactorily when the commonly used delay detonators are replaced by electric detonators and the delay in initiating the detonation of an explosive charge is controlled by means of sequential signals at appropriate time intervals transmitted to the electric detonators. Accordingly we provide a process of sequential blasting as hereinbefore described wherein the detonating means is a non-delay detonating means, preferably an electric detonator. Such a process is particularly useful when the desired time interval between successive detonations is small say from 1 to 25 milliseconds, and can also be useful where greater time intervals are desired although in such an instance delay detonators would more commonly be used. A combination of delay and non-delay detonating means may be used if desired to achieve a combination of time intervals beyond the range of delay detonating means. By suitable choice of time switches in our device, not only can the desired time delay be achieved accurately but the variation from the optimum time required may also be maintained within small limits. It will be appreciated that in our blasting processes a single detonating means may be connected to one of our devices or alternatively a series of detonating means, for example a ring of detonators, may be connected. In the latter instance the initial delay in detonation is provided by our device and subsequent delays within such a ring is provided by means of conventional delay detonating means.

In the foregoing description the use of our device has been illustrated by reference to blasting processes. It will be appreciated that the use of our devices is in no way limited to such processes and that it finds application in many other processes where a series of operations is required. Thus for example it is useful as an aid in weaving operations where a complicated pattern is to be produceed by the programmed introduction and withdrawal of yarns of differing types. It may also be used in controlling chemical processes involving for example the addition of reagents to a reaction mixture. Yet again it finds application in industries involving repetative operations such as mechanical grinding or polishing of metal or glass surfaces. An advantage of our device lies not only in the facility with which signals of desired duration, accuracy and time interval may be transmitted to a location to activate an apparatus or to control a mechanism but in the ease by which a sequence of steps in an operation may be halted if one of the steps is not performed as desired. A further advantage is that by suitable construction our device may be incorporated into a portable detonating apparatus useful in underground or open cut mining operations. Portability is increased when our device is constructed by means of printed circuit boards and encapsulation of the components of the device. A very practical advantage of our device when used in mining lies in the reduction of vibration in a mining area subsequent to a series of detonations by means of our device. It is believed that this reduction, an important factor in mine safety, is related to the accuracy with which the delay periods between successive detonations may be controlled.

The invention will be further described by way of example with reference to the accompanying drawings which illustrate one embodiment of the invention by which delay detonators in each of two rings of detonators, each ring comprising 50 "L" series delay detonators connected in series with one another via 80 foot leads each separate detonator being placed at the toe end of a bore hole drilled in an ore body and loaded with 100 lbs of an ammonium nitrate slurry explosive composition, were detonated in sequence at fifty millisecond time intervals, the activation of the first ring occurring simultaneously with the pressing of the firing button and the second ring being activated 50 milliseconds later. It will be seen that a further ring or rings of detonators may also be activated from the second ring by way of a signal output obtained when the second ring is fired.

Figure 4:
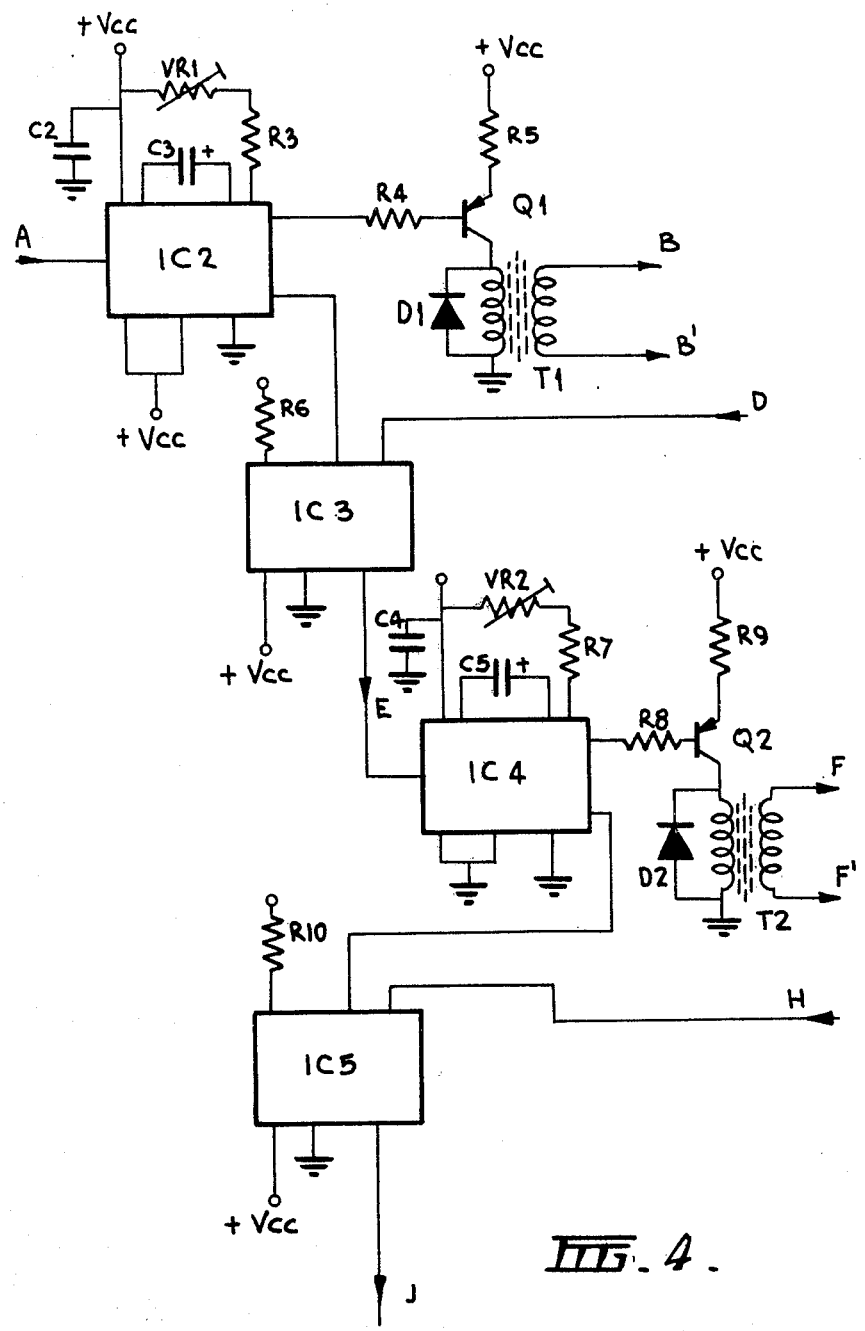

FIG. 4 is a detailed circuit diagram of a timing unit from which one signal output can be obtained to actuate a switch and subseqently activate a ring of detonators simultaneously with the application of the signal from the firing circuit, a second signal being generated to activate a second ring of detonators after a time delay and providing that current has flowed in the first ring of sufficient amplitude to have activated the detonators in the first ring. Providing that the same conditions regarding current flow in the first ring No. 1 of detonators applies to a second ring No. 2, then a third signal will be generated and will be available to trigger a subsequent circuit if required at a predetermined time interval after the firing of ring No. 2. Any number of these units may be interconnected to control any number of detonator rings as required.

Figure 5:
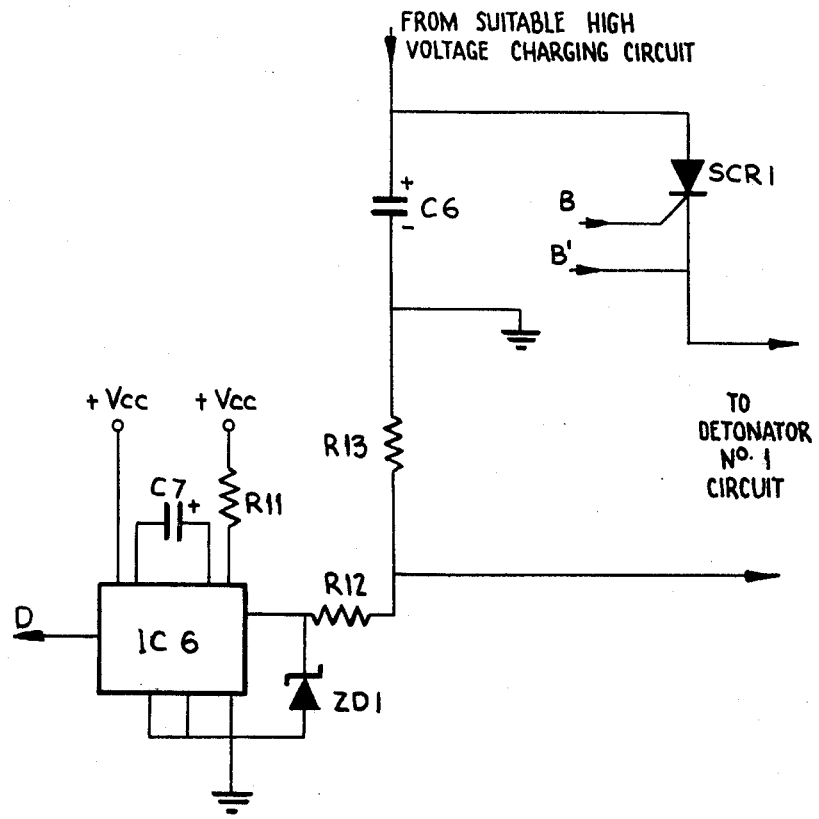

FIG. 5 is a detailed circuit diagram of the energy storage, switching and detonator ring current monitoring circuit for one detonator ring only. The operation of the circuits will now be described by reference to the individual detailed circuit diagrams and the timing diagram and waveforms. No details of power supplies have been given, voltages being obtained from a series of dry cells connected to provide a voltage of 12 volts to the apparatus. The output of these cells is fed firstly to a suitable series voltage regulator to provide the required voltage to operate the integrated circuits and associated components and secondly to a DC to DC transistorised converter to provide the charging supply for the supply capacitors for the detonator firing circuits.

Figure 1:
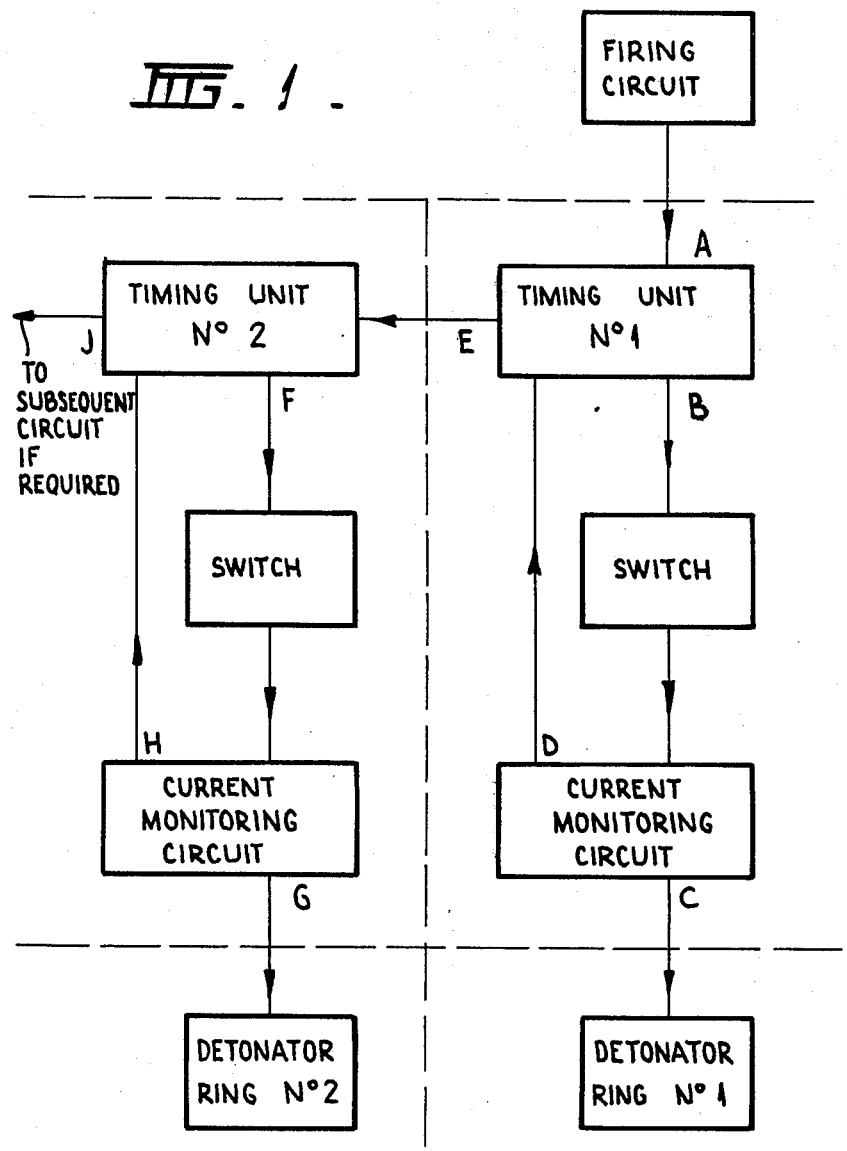
FIG. 1 is a block schematic diagram showing the sequential connection of units to give the required delayed outputs to the rings of detonators and the output circuit from which a signal may be obtained to trigger further delay circuits if more than two circuits are to be fired in the one sequence.
Figure 2:
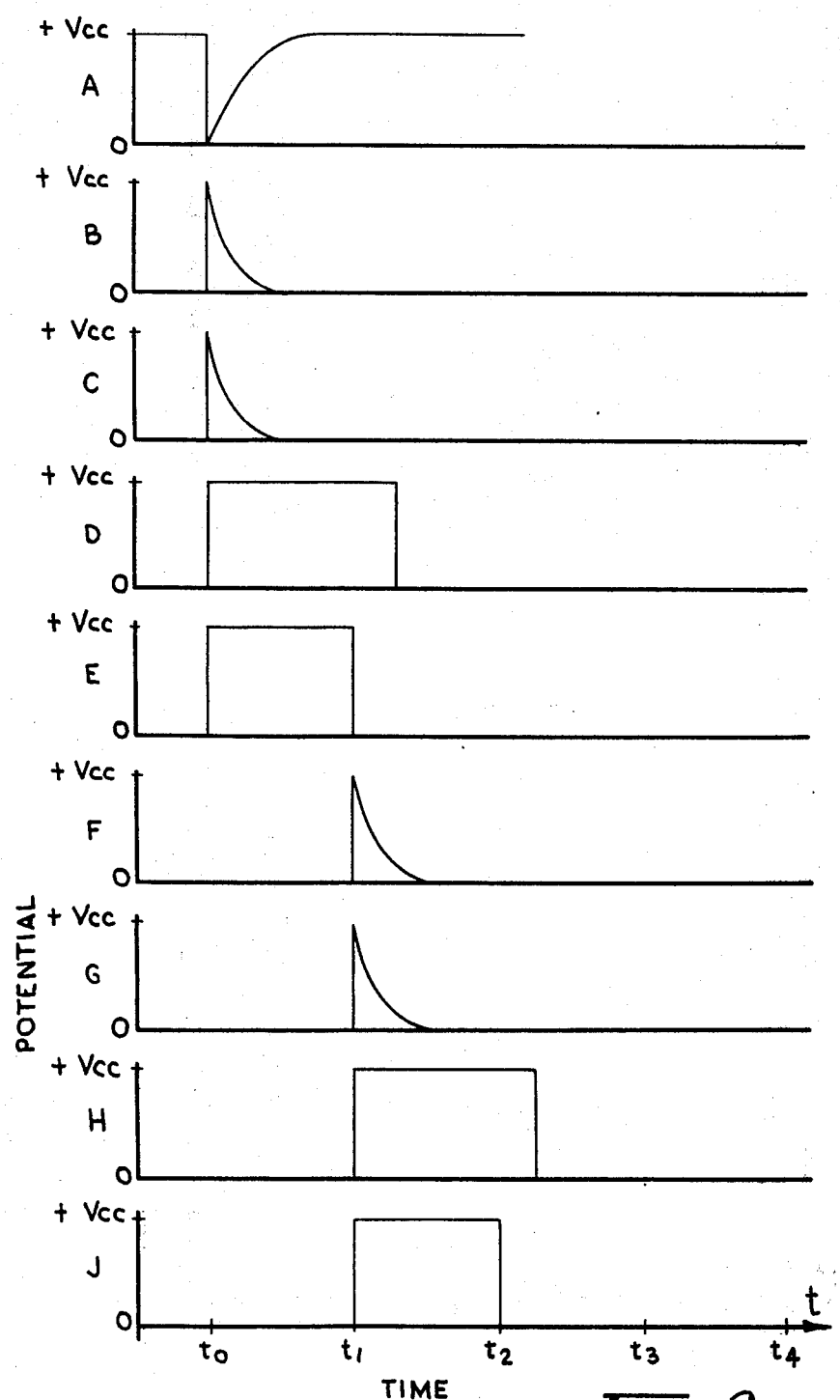
FIG. 2 is a timing diagram illustrating certain waveforms and sequences obtained in the operation of the elements of FIG. 1.
Figure 3:
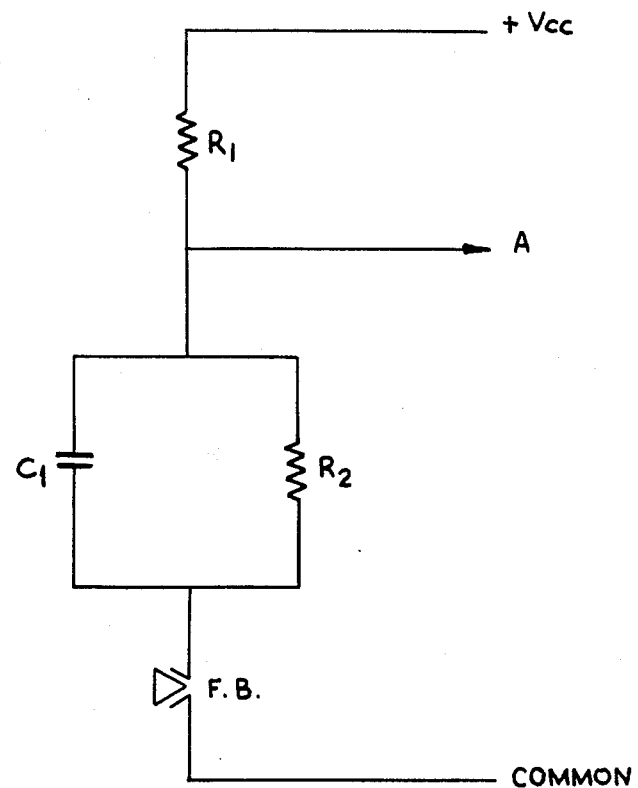
FIG. 3 is a detailed circuit diagram of one form of firing circuit which may be used to activate the timing unit of FIG. 4.

Operation of the circuit is then as follows:

Pressing a firing button FB (FIG. 3) causes the potential at point A in the circuit to be shifted from a potential approximately equal to + Vcc to approximately earth potential, generating a negative-going electrical pulse or first starting signal as shown in FIG. 2 A. The duration of this pulse will be determined by the time constant of a capacitor C1 and a resistor R2 in combination and is chosen so that it is not possible to generate a second pulse at point A until such time as the complete sequence of pulses to the detonators has been generated.

The pulse at point A is applied to the input of a first timing means which in the exemplary embodiment is an integrated circuit IC2 (FIG. 4) which is a monostable multivibrator the circuit of which is arranged so that it will switch only with the application of a negative-going pulse at the input. Two outputs (one the reciprocal of the other) are available from IC2. One output is applied to activate the first electrical load circuit via the base of a transistor Q1, FIG. 4 through R4 turning Q1 on to saturation and causing a differentiated output to appear at the output of transformer T1, FIG. 4 between points B and $B^1$ in the circuit of sufficient amplitude to trigger the gate circuit of a silicon controlled rectifier SCR1, FIG. 5. The negative pulse appearing at the output of T1, coinciding with the turn-off of IC2, is clipped by a diode D1 to a value which is below any figure which would damage the gate circuit of SCR1. The second output is a timed output signal which defines a first preselected timing interval and is applied to an input of a first logic means comprising an integrated circuit IC3 (an "AND" gate) biasing this input of IC3 to an on-state for the duration of the pulse generated by IC2. The duration of this pulse is determined by the values of a capacitor C3, a resistor R3 and a variable resistor VR1 in combination and the duration of this pulse will determine the time interval between the firing of detonator ring No. 1 and detonator ring No. 2.

As capacitor C6 (FIG. 5) has been previously charged to the required high voltage, (determined by the number and type of detonators to be fired in the external ring) when the silicon controlled rectifier SCR1 is switched on by the application of the pulse between points B and B' at time $t_0$, providing the detonator ring circuit is complete, current will flow through the ring and through resistor R13 (in series) FIG. 2C, activating the detonators and generating a voltage across R13. This voltage is applied to the input circuit of integrated circuit IC6, FIG. 5 which is another monostable multivibrator, the circuit of which is connected in such a way that the multivibrator switches when a positive going pulse such as that obtained from R13 is applied. The switching period of IC6 is adjusted to exceed the time period $(t_1 - t_0)$ FIG. 2 by at least 10%. Only one output from IC6 is used (FIG. 2D) and is applied as a first feedback signal to the second input of the "AND"-gate (IC3). Both inputs of the "AND"-gate are now biased to an on-state and an output signal from the "AND"-gate will be obtained as depicted in FIG. 2E. It should be noted that the output from the "AND"-gate will switch off at time $t_1$ as the input from IC2 will turn off at this time, thereby closing the gate.

This output (FIG. 2E) is then fed to the input of a second timing means comprising integrated circuit IC4, FIG. 4 (connected as for IC2 and therefore responsive only to negative-going pulses). IC4 will now switch on at time $t_1$ and output will be obtained as depicted in FIG. 2F, repeating the sequence which occurred for detonator ring No. 1, for detonator ring No. 2, but with the actuating pulse or second starting signal now originating at time $t_1$ instead of $t_0$, resulting in ring No. 2 being activated $(t_1 - t_0)$ seconds after ring No. 1 has been activated. If a third external circuit is required a similar monitoring circuit, as used in conjunction with detonator ring No. 1, must be used in conjunction with the circuit for ring No. 2, the output pulse (FIG. 2H) of which is fed to the second input of integrated circuit IC5 (FIG. 4), the first input of which is already switched on by the reciprocal output of IC4, output from IC5 (FIG. 2J) thus being obtained to be used to trigger a further input circuit at time $t_2$.

We have so far considered that in the case of both detonator rings No. 1 and No. 2 that both circuits were complete and that sufficient current flowed from the supply capacitor (in ring No. 1 this capacitor was C6) to activate all the detonators in the ring. Let us now consider that detonator ring No. 1 is faulty in that it is either completely open-circuited or that the resistance of the ring is too high to allow sufficient current to flow through the detonators to cause efficient activation of the fuse heads. In either of the above two cases, the voltage generated across R13 will be too low to switch IC6 and no output from IC6 will be obtained. This now means that no input to input No. 2 of the "AND"-gate IC3, will be obtained and the gate will not be opened, thus preventing the output pulse from IC2 being applied to the input of IC4 and thereby preventing detonator ring No. 2 from being activated. If No. 2 ring was not activated no output would be available to No. 3 ring or subsequent rings. Similarly if ring No. 1 was satisfactory but ring No. 2 was faulty, ring No. 1 would be activated but ring No. 2 and all subsequent rings would not be activated.

The following examples further illustrate, but in no way limit, the devices of our invention and processes wherein they may be used.

EXAMPLE 1

An apparatus comprising a device according to our invention substantially as hereinbefore described and depicted in the accompanying figures and wherein the values of the following components were as follows:- R1 = 680 ohms, R2 = 10 megohms, R3 = 680 ohms, R7 = 680 ohms, R11 = 6800 ohms, R12 = 100 ohms, R13 = 0.5 ohms, C1 = 0.1 microfarad, C3 = 15 microfarad, C5 = 15 microfarad, C6 = 6 microfarad, C7 = 15 microfarad, VR1 = 2000 ohms, VR2 = 2000 ohms and ZD1 was a 4.3 volt, Zener Diode, was constructed and connected to two series each of three delay detonators in a ring configuration, the said detonators being capable on activation by an electric charge of initiating the detonation of a series of six explosive compositions. The detonators in ring No. 1 had delay periods of 25, 50, and 75 milliseconds respectively. An identical set of detonators was used in ring No. 2. The apparatus was actuated whereby a first electrical pulse was transmitted to ring No. 1 and 55 milliseconds after the transmission of the first pulse a second pulse was transmitted to ring No. 2. It was observed that sequential detonation of the explosive compositions was obtained at times of 25, 50, 75, 80, 105 and 130 milliseconds after the apparatus has been actuated.

EXAMPLE 2

Each of a series of five electric, non-delay, detonators A, B, C, D and E was attached as a detonating means to a small explosive charge and covered with sand. The primed charges were separated from each other by a distance of about 20 yards and were then connected by means of conducting wires each to a device substantially as hereinbefore described and depicted in the accompanying figures. The component values in each device were as in Example 1. The devices were electrically connected to each other and the time switch on each device was set so that on actuation of the detonating apparatus comprising the devices electrical energy was transmitted to the detonators as follows. A received its energy immediately the apparatus was actuated; B 60 milliseconds later than A; C 70 milliseconds after B; D 55 milliseconds after C; and E 40 milliseconds after D. The apparatus was actuated and it was observed by means of calibrated cine photography that each of the explosive charges was detonated in the expected sequence of A, B, C, D and finally E, within 1 millisecond of the desired time.

EXAMPLE 3

The procedure of Example 2 was repeated but detonator D was not connected to the apparatus. It was observed that whilst the explosive charges connected to detonators A, B and C were detonated in the expected sequence there was no detonation of the charge connected to detonator E.

EXAMPLE 4

The procedure of Example 2 was repeated but the values of capacitors C3 and C5 were each reduced to 1.5 microfarads and the elapsed time period between each detonation was adjusted to 5 milliseconds. On activation of the apparatus, the explosive charges were detonated in the expected sequence at approximately 5 millisecond intervals.

EXAMPLE 5

This example demonstrates the use of one embodiment of our device in ring blasting operations in a mine. From six drives in an underground copper mine there were bored 160 cylindrical holes in a first part of the orebody which extended from a face of the orebody to a distance about eight feet into the body. The holes ranged in length from 10 feet to 72 feet and had a nominal diameter of 2¼ inches. These holes were each then primed in the vicinity of their toe with an L series delay detonator attached to conducting wires, the said detonators having delay times ranging from 227 to 714 milliseconds. Into each borehole there was placed a charge of an explosive composition in the form of a gelled aluminized ammonium nitrate slurry. The conducting wires attached to the detonators in 80 of the holes were connected in series so that the detonators in proximity to the explosive charges in these holes were connected to form part of a first ring and the part ring so formed was then connected by further conducting wire to a first apparatus comprising a device according to our invention and described in Example 1. The conducting wires attached to the detonators in the remainder of the holes were connected in a similar manner to form the residual part of a first ring and the residual part ring so formed was then connected by further conducting wire to a second apparatus comprising a device according to our invention and described in Example 1. In a similar manner to further 160 holes in a second part of the orebody, extending into the orebody for about a further 8 feet from the first part of the orebody referred to above, were primed, loaded with an explosive composition and the detonators therein connected as a second ring to the first apparatus and second apparatus referred to above. The first apparatus and second apparatus were then interconnected and simultaneously actuated from a common firing line whereby a first electrical pulse was transmitted from each apparatus to the part of the first ring to which each apparatus had been connected and 55 milliseconds after the transmission of the first pulse a second electrical pulse was transmitted in a similar manner to the second ring. The detonators in each ring were thus activated and caused the explosive charges to explode in a desired sequence and at desired time intervals. By this means approximately 45,000 tons of broken ore was obtained in one blasting operation. It was observed the broken ore so obtained was generally of better fragmentation than that obtained by conventional blasting techniques. It was also observed that the degree of vibration subsequent to the explosion described above was noticeably less than the vibration induced by conventional blasting operations in the same orebody.

I claim:
1. Electrical timing and control apparatus for sequentially activating a plurality of electrical load circuits at predetermined and controllable successive timing intervals after the occurrence of a first starting signal wherein the activation sequence is automatically halted whenever any one of the electrical load circuits fails to be successfully activated, said apparatus comprising:
first timing means connected to receive said first starting signal and to produce a first timed output signal which defines a first preselected timing interval,
first activation means connected to activate a first electrical load circuit at a first time corresponding to the time occurrence of saidi first starting signal,
first feedback means connected to detect the successful activation of said first electrical load circuit and to produce a first feedback signal in response thereto,
first logic means connected to receive both said first timed output signal and said first feedback signal and to produce a second starting signal occurring at a time interval subsequent to said first starting signal as determined by said first preselected timing interval, said second starting signal only being produced if both said first feedback signal and said first timed output signal are received by said first logic means, and
second activation means connected to activate a second electrical load circuit at a second time cor- responding to the time occurrence of said second starting signal.

2. Apparatus as in claim 1 further comprising:
second timing means connected to receive said second starting signal and to produce a second timed output signal which defines a second preselected timing interval,
second feedback means connected to detect the successful activation of said second electrical load circuit and to produce a second feedbacck signal in response thereto,
second logic means connected to receive both said second timed output signal and said second feedback signal and to produce a third starting signal occurring at a time interval subsequent to said second starting signal as determined by said second preselected timing interval, said third starting signal only being produced if both said second feedback signal and said second timed output signal are received by said second logic means, and
third activation means connected to activate a third electrical load circuit at a third time corresponding to the time occurrence of said third starting signal.

3. Apparatus as in claim 2 wherein said first and second timing means each include adjustment means for independently varying and controlling said first and second preselected timing intervals respectively.

4. Apparatus as in claim 2 wherein said electrical load circuits comprise explosive detonator devices.

5. Apparatus as in claim 4 wherein each of said electrical load circuits comprises a plurality of detonator devices.

6. Apparatus as in claim 5 whereing the plurality of detonator devices in each of said electrical load circuits includes timing devices for causing successive activation of the individual detonator devices once the corresponding load circuit is activated by its respectively associated activation means.

7. Apparatus as in claim 2 wherein said feedback means includes means responsive to the magntidue of electrical current flowing in the respectively associated electrical load circuits.

8. Apparatus as in claim 1 wherein said first means for producing a first starting signal comprises a manually actuated firing button switch means.

9. Apparatus as in claim 1 wherein said first timing means comprises a monostable multivibrator.

10. Apparatus as in claim 1 wherein each of said activation means comprises a normally charged capacitor and an electrically controlled switch for connecting the corresponding electrical load circuit into a discharge circuit with said capacitor.

11. Apparatus as in claim 1 wherein said first feedback means comprises a monostable multivibrator connected for triggering in response to the flow of at least a predetermined amount of electrical current in the first electrical load and producing the first feedback signal having a time duration overlapping that of said first preselected timing interval.

12. Apparatus as in claim 1 wherein said first logic means comprises a logic gate which produces the second starting signal as an output in dependence upon the concurrence and non-concurrence of input signals thereto.

13. Electrical timing and control device for sequentially activating a plurality of electrical load circuits at predetermined and controllable successive timing intervals wherein the activation sequence is automatically halted whenever any one of the electrical load circuits fails to be successfully activated, said device comprising:
first means for producing a first starting signal,
first timing means connected to receive said first starting signal and to produce a first timed output signal which defines a first preselected timing interval,
first activation means connected to activate a first electrical load circuit at a first time corresponding to the time occurrence of said first starting signal,
first feedback means connected to detect the successful activation of said first electrical load circuit and to produce a first timed feedback signal which defines a second preselected timing interval in response thereto,
first logic means connected to receive both said first timed output signal and said first timed feedbaack signal and to produce a second starting signal occurring at a time interval subsequent to said first starting signal as determined by the change from concurrence to non-concurrence of the input signals to the first logic means, and
second activation means connected to activate a second electrical load circuit at a second time corresponding to the time occurrence of said second starting signal.

14. Apparatus comprising the combination of two or more devices according to claim 13 connected in series so that the second activation means of one device is the first means for producing a first starting signal of the next device.

15. Apparatus as in claim 14 wherein each device includes an adjustment means for independently controlling the preselected timing intervals of each device.

16. Apparatus as in claim 13 wherein said second preselected timing interval finishes after the termination of the first preselected timing interval.

* * * * *